United States Patent
Fukui et al.

(10) Patent No.: US 12,119,322 B2
(45) Date of Patent: Oct. 15, 2024

(54) BONDING MEMBER FOR SEMICONDUCTOR DEVICE

(71) Applicant: SUPERUFO291 TEC, Kyoto (JP)

(72) Inventors: Akira Fukui, Kyoto (JP); Toshie Fukui, Kyoto (JP)

(73) Assignee: SUPERUFO291 TEC, Kyoto (JP)

( * ) Notice: Subject to any disclaimer, the term of this patent is extended or adjusted under 35 U.S.C. 154(b) by 136 days.

(21) Appl. No.: 18/014,272

(22) PCT Filed: Jun. 28, 2021

(86) PCT No.: PCT/JP2021/024313
§ 371 (c)(1),
(2) Date: Jul. 14, 2023

(87) PCT Pub. No.: WO2022/059286
PCT Pub. Date: Mar. 24, 2022

(65) Prior Publication Data
US 2023/0395550 A1    Dec. 7, 2023

(30) Foreign Application Priority Data
Sep. 18, 2020   (JP) ................. 2020-157041

(51) Int. Cl.
*H01L 23/48*    (2006.01)
*B23K 35/02*    (2006.01)
(Continued)

(52) U.S. Cl.
CPC .......... *H01L 24/29* (2013.01); *B23K 35/0233* (2013.01); *B23K 35/3006* (2013.01);
(Continued)

(58) Field of Classification Search
CPC ......... H01L 24/29; H01L 24/05; H01L 24/32; H01L 2224/05155; H01L 2224/05573;
(Continued)

(56) References Cited

U.S. PATENT DOCUMENTS

2008/0122050 A1*   5/2008   Ikeda ................. H01L 24/75
257/E23.044

FOREIGN PATENT DOCUMENTS

| JP | H04-192341 A | 7/1992 |
| JP | 2001-110959 A | 4/2001 |

(Continued)

OTHER PUBLICATIONS

Aug. 31, 2021 International Search Report issued in International Patent Application No. PCT/JP2021/024313.
(Continued)

*Primary Examiner* — Niki H Nguyen
(74) *Attorney, Agent, or Firm* — Oliff PLC

(57) ABSTRACT

A bonding member 10 used for bonding a semiconductor device 20 and a substrate 30, the bonding member including: a thermal stress relieving layer 11 made of any of Ag, Cu, Au, and Al; a first Ag brazing material layer 12 containing Ag and Sn as main components and provided on a side of the thermal stress relieving layer to which the semiconductor device is bonded; a second Ag brazing material layer 13 containing Ag and Sn as main components and provided on a side of the thermal stress relieving layer to which the substrate is bonded; a first barrier layer 14 made of Ni and/or Ni alloy and provided between the thermal stress relieving layer and the first Ag brazing material layer; and a second barrier layer 15 made of Ni and/or Ni alloy and provided between the stress relieving layer and the second Ag brazing material layer, in which a thermal conductivity of the bonding member after a power cycle test is 200 W/m·K or more.

6 Claims, 1 Drawing Sheet

(51) Int. Cl.
*B23K 35/30* (2006.01)
*H01L 23/00* (2006.01)
*H01L 23/52* (2006.01)
*H01L 29/40* (2006.01)
*B23K 101/40* (2006.01)

(52) U.S. Cl.
CPC .......... *B23K 2101/40* (2018.08); *H01L 24/05* (2013.01); *H01L 24/32* (2013.01); *H01L 2224/05155* (2013.01); *H01L 2224/05573* (2013.01); *H01L 2224/05639* (2013.01); *H01L 2224/05644* (2013.01); *H01L 2224/05647* (2013.01); *H01L 2224/05655* (2013.01); *H01L 2224/05657* (2013.01); *H01L 2224/2908* (2013.01); *H01L 2224/29111* (2013.01); *H01L 2224/29124* (2013.01); *H01L 2224/29139* (2013.01); *H01L 2224/29144* (2013.01); *H01L 2224/29147* (2013.01); *H01L 2224/29155* (2013.01); *H01L 2224/32245* (2013.01); *H01L 2924/0132* (2013.01); *H01L 2924/10272* (2013.01); *H01L 2924/13055* (2013.01)

(58) Field of Classification Search
CPC . H01L 2224/05639; H01L 2224/05644; H01L 2224/05647; H01L 2224/05655; H01L 2224/05657; H01L 2224/2908; H01L 2224/29111; H01L 2224/29124; H01L 2224/29139; H01L 2224/29144; H01L 2224/29147; H01L 2224/29155; H01L 2224/32245; H01L 2924/0132; H01L 2924/10272; H01L 2924/19107; H01L 2224/16013; H01L 2224/16225; H01L 2224/16238; H01L 2224/81191; H01L 2224/81192; H01L 2224/81205; H01L 2224/81815; H01L 2224/83205; H01L 2224/83801; H01L 2224/8384; H01L 2224/84801; H01L 2224/8484; H01L 2224/85205; H01L 24/13; H01L 24/16; H01L 24/33; H01L 24/37; H01L 24/40; H01L 2223/6644; H01L 24/26; B23K 35/0233; B23K 35/3006; B23K 2101/40; B23K 1/0016; B23K 1/00; B23K 1/20
See application file for complete search history.

(56) References Cited

FOREIGN PATENT DOCUMENTS

| | | |
|---|---|---|
| JP | 2006-32888 A | 2/2006 |
| JP | 2013-229474 A | 11/2013 |
| JP | 2019-36603 A | 3/2019 |
| JP | 2019-79960 A | 5/2019 |
| JP | 6516277 B1 | 5/2019 |
| JP | 2020-98848 A | 6/2020 |
| WO | 2017/183222 A1 | 10/2017 |

OTHER PUBLICATIONS

Aug. 31, 2021 Written Opinion issued in International Patent Application No. PCT/JP2021/024313.

Introduction for Katsuaki Suganuma et al. "System Integration of Wide Band Gap Semiconductors". May 31, 2016, CMC Publishing Co., Ltd.

Daisuke Hiratsuka et al. "Die-Bonding Material and Sintering Joining Technology for Power Semiconductors Allowing Operation at High Temperatures". Toshiba Corporation, Nov. 2015, vol. 70, No. 11, pp. 46-49.

Toshiaki Morita. "High Thermal Resistance and Low Thermal Resistance Pb-FREE Junction Technique Using Ag Nanoparticles and Development to Power Semiconductor Module Mounting". Dec. 2008, Osaka University, Graduate School of Engineering.

Shinichi Yasaka et al. "Study of Power Cycling Test Methods for Evaluation of Die Attach Materials". Oct. 1, 2016, Kanagawa Industrial Technology Center.

Akira Morozumi et al. "Reliability Design Technique in Power Semiconductor Module". Feb. 10, 2001, Fuji Electric Co., Ltd.

Koji Yamaguchi et al. "Quality and Reliability Integration Technology in Automotive Semiconductor Products". Mar. 10, 2011, Fuji Electric Co., Ltd.

Jan. 4, 2024 Extended Search Report issued in European Patent Application No. 21868973.5.

* cited by examiner

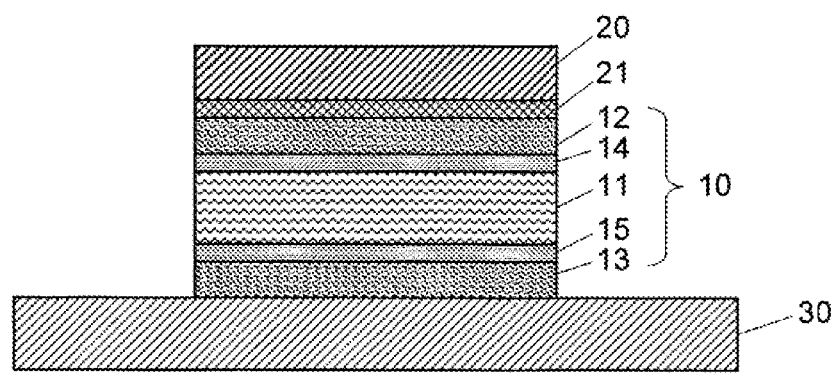

BONDING MEMBER FOR SEMICONDUCTOR DEVICE

TECHNICAL FIELD

The present invention relates to a bonding member used for bonding a semiconductor device and a substrate such as one used as both electrode and heat release substrate (which will be referred to as an "electrode and heat release substrate").

BACKGROUND ART

Electrically powered vehicles (for example, an electric vehicle (EV)) are becoming widespread in countries around the world. Under such circumstances, efforts to downsizing and high performance of an inverter or the like using a Si semiconductor device or a SiC semiconductor device have been made for use in a motor control device or the like.

In a small and high-performance semiconductor module such as an insulated gate bipolar transistor (IGBT), it is necessary to release a large amount of heat generated in a semiconductor device to an electrode and heat release substrate in order to cool the semiconductor device. The linear expansion coefficient of Si, SiC, or GaN constituting the semiconductor device (in many cases, a Ni layer or the like serving as both an electrode and a bonding layer is provided on a bonding surface of the semiconductor device.) is as small as in a range of 4 to 6 ppm/K. On the other hand, the linear expansion coefficient of Cu constituting the electrode and heat release substrate is as large as 17 ppm/K. Considering the heat release efficiency from the semiconductor device, it is desirable to bond the electrode and heat release substrate directly, i.e. without interposing anything, to the semiconductor device, which is a heat generating element. A technique of a high vacuum pressure heating method has been developed in order to perform such bonding. However, materials of the semiconductor device and the heat release substrate are different from each other, and as described above, there is a large difference in linear expansion coefficient between the semiconductor device and the heat release substrate. It is well known that when such a semiconductor device as IGBT works, heat is generated from the semiconductor device, and thermal stress occurs at a bonding face between the semiconductor device and the electrode and heat release substrate, resulting in a separation between the semiconductor device and the electrode and heat release substrate. No device in which the semiconductor device and the electrode and heat release substrate are directly bonded has yet been put into practical use. At present, the thermal stress is alleviated by bonding the semiconductor device and the electrode and heat release substrate with flexible solder of a certain thickness. Since the stress relaxing ability is insufficient when the thickness is 10 µm or less, many products are made in which the two members are bonded by solder having a thickness of 30 to 300 µm (often 50 to 150 µm). In particular, in such a semiconductor device as IGBT which generates a large amount of heat, a die bond (bonding) technique for bonding a semiconductor device and an electrode and heat release substrate is important.

Since an electrode and heat release substrate to be attached to a semiconductor device of an IGBT or the like is required to have electrical conductivity, a substrate made of Cu or Cu alloy is mainly used. However, in a case where a semiconductor device is bonded to an electrode and heat release substrate made of a thick and large Cu plate by Pb-based or Sn-based solder, there is a problem that when such a semiconductor device as IGBT works, heat is generated in the semiconductor device, and the semiconductor device and the electrode and heat release substrate separate due to a difference in linear expansion coefficient. In order to cope with this problem, in mass-produced products, a direct bonded cupper (DBC), in which the apparent linear expansion coefficient of the electrode and heat release substrate is reduced to 7 to 10 ppm/K by bonding thin Cu foils to upper and lower surfaces of a ceramic substrate by various methods (including Ag brazing using AgCuSnTi or the like having high heat resistance and high thermal conductivity), and a semiconductor device are bonded by Pb-based or Sn-based solder so that the highest operation temperature is raised to 150° C. Furthermore, an IGBT in which the highest operation temperature is raised to 175° C. by devising a type of solder has also been reported. However, it is considered that there is a limit to further increase the operation temperature. In addition, if the Cu foil is made thinner than the thickness of the ceramic, the linear expansion coefficient of the DBC can be decreased, but there is another problem that the thermal conductivity decreases. In recent years, DBC in which thick Cu is attached has been developed in order to improve thermal conductivity, but when Cu is thickened, the value of linear expansion coefficient of the DBC becomes close to that of Cu, and separation may occur due to thermal stress in bonding by solder. There is also a method in which an electrode part and an insulating part are separately prepared, but it is difficult to bond a thick and large Cu plate and the ceramic substrate with solder. Furthermore, for bonding the ceramic and a cooler, thermal grease is used which is a flexible resin. However, since the resin has a very low thermal conductivity of 0.1 to 1 W/m·K, there is a restriction that heat needs to be released by a method of cooling both surfaces of the semiconductor device.

In recent years, developments have been actively conducted focusing on soldering, but even when Pb-based or Sn-based solder having the melting point as high as 200° C. or higher is used, a problem occurs in a heat cycle test at 200° C. Even in the case of Au solder having the melting point of 356° C., the same problem occurs in the heat cycle test at 225° C. It has been found that these are caused by the fact that a micro-structure of the solder greatly changes and the solder deteriorates when a heat cycle test at 200° C. or higher is performed.

Therefore, developments of new bonding materials in place of solder have been made. A representative one of such bonding members uses Ag nano-particles (nano-sized Ag particles). When Ag nano-particles are used, it is possible to bond the semiconductor device and the electrode and heat release substrate to each other at a low temperature of about 200° C., and it is expected to obtain characteristics that thermal conductivity is as high as 200 W/m·K or more and the melting point after bonding is also as high as 960° C. For example, Non Patent Literatures 1 to 3 describe a phenomenon in which Ag nano-particles can be sintered (low-temperature sintering) at a temperature lower than the melting point of the bulk material due to their high surface activity. However, Patent Literature 2 reports that expected properties are significantly deteriorated in a heat test in which the bonding member formed by sintering Ag nano-particles is left at 250° C. Non Patent Literature 3 reports, regarding a power semiconductor module using Ag nano-particles as a die bond material, that, from a result of a heat cycle test in which cooling to −40° C. and heating to 125° C. are repeated, expected reliability similar to that in the case of using solder as a die bond material can be obtained. However, in this bonding member, there are parts where secondary particles grown from the Ag nano-particles are not sintered (unsintered parts of the secondary particles) and voids. Therefore, sufficient strength cannot be obtained, and when a heat cycle test reaching 300° C. is performed, cracking or chipping starting from grain boundaries likely occurs, so that it is difficult to bond a semiconductor device having a highest operation temperature of 300° C.

The sintering start temperature of a general Ag powder is 450° C. or higher. When the Ag powder is sintered under a load of 30 MPa and temperature of 900° C., a sintered body having a thermal conductivity (420 W/m·K) equivalent to that of a pure Ag plate is obtained. When sintering is performed at a pressure lower than this, the amount of voids existing in the sintered body increases. There is a correlation between the amount of voids included in the body and the thermal conductivity of the body. Since the Ag nano-particles are very fine, it is said that the Ag nano-particles are uniformly sintered, but strictly speaking, it is also said that a large number of microvoids are present. Furthermore, it is said that the thermal conductivity of the sintered body with the bonding temperature set to 300° C. was 250 W/m·K, which is considered to be a result of partial progress of sintering of the secondary particles. On the other hand, it is also said that large voids are generated in this sintered body. For example, when the thermal conductivity of the prepared sintered body is 200 W/m·K, there is a 52% decrease in thermal conductivity, as 1−(200/420)=0.52, which reflects that unsintered parts of the secondary particles and microvoids are present in 52% of the sintered body due to insufficient sintering. When the thermal conductivity is 250 W/m·K, the thermal conductivity decreases by 40%, as 1−(250/420)=0.40, which reflects that voids larger than microvoids are present in addition to that unsintered parts of the secondary particles and microvoids are present in 40% of the sintered body due to insufficient sintering. This is considered to be a cause of fatigue deterioration of the nano-Ag bonding member in the heat test or the heat cycle test. In addition, the reason why the use of the Ag nano-particles has not progressed even in the IGBT having a low operation temperature is that the price of the Ag nano-particles is very expensive and higher than that of bulk Au (50 to 100 times higher than the bulk Ag nominal value), and there is no possibility that the price will significantly decrease in the future.

CITATION LIST

Patent Literature

Patent Literature 1: JP 6516277 B1
Patent Literature 2: JP 2013-229474 A
Patent Literature 3: JP 2019-36603 A
Patent Literature 4: JP 2019-79960 A Non Patent Literature Non Patent Literature 1: Katsuaki Suganuma et al., "System Integration of Wide Band Gap Semiconductors", May 31, 2016, CMC Publishing Co., Ltd.
Non Patent Literature 2: Daisuke Hiratsuka et al., "DIE-BONDING MATERIAL AND SINTERING JOINING TECHNOLOGY FOR POWER SEMICONDUCTORS ALLOWING OPERATION AT HIGH TEMPERATURES", TOSHIBA CORPORATION, Vol. 70, No. 11, 2015, p. 46-49, November 2015
Non Patent Literature 3: Toshiaki Morita, "HIGH THERMAL RESISTANCE AND LOW THERMAL RESISTANCE Pb-FREE JUNCTION TECHNIQUE USING Ag NANOPARTICLES AND DEVELOPMENT TO POWER SEMICONDUCTOR MODULE MOUNTING", December 2008, Osaka University, Graduate School of Engineering
Non Patent Literature 4: Shinichi Yasaka et al., "STUDY OF POWER CYCLING TEST METHODS FOR EVALUATION OF DIE ATTACH MATERIALS", Oct. 1, 2016, Kanagawa Industrial Technology Center
Non Patent Literature 5: Akira Morozumi et al., "Reliability design technique in power semiconductor module", Feb. 10, 2001, Fuji Electric Co., Ltd.
Non Patent Literature 6: Koji Yamaguchi et al., "Quality and Reliability Integration Technology in Automotive Semiconductor Products", Mar. 10, 2011, Fuji Electric Co., Ltd.

SUMMARY OF INVENTION

Technical Problem

The present inventors have proposed a new bonding member in Patent Literature 1. Under the condition that the semiconductor device will not break, the semiconductor device and the electrode and heat release substrate are bonded by a liquid phase diffusion method (including a liquid phase sintering method, a reaction sintering method, a transition sintering method, and an infiltration sintering method.) using Sn and at least one of Ag, Cu and Au. In this bonding member, voids generated at the time of liquid phase diffusion are used for alleviating thermal stress generated between the semiconductor device and the electrode and heat release substrate. In this bonding member, by using an alloy containing Ag or the like and Sn as main components, a decrease in thermal conductivity due to the presence of voids and breakage occurring from the voids as a starting point are avoided.

Specifically, the bonding member is made of an alloy containing Sn and at least one of Ag, Cu and Au as main components and having the melting point of 500° C. or higher, and has a plurality of voids inside, whose total volume is 5% or more and 40% or less of the entire volume. This bonding member has been developed mainly for the purpose of bonding a large semiconductor device and an electrode and heat release substrate. In Patent Literature 1, for example, a semiconductor device and an electrode and heat release substrate are bonded by a liquid phase diffusion method in which powder of Ag and Sn is contained as a main component and a pressure of 1 MPa is applied for 5 minutes while being heated to 300° C. in a non-oxidizing atmosphere, thereby Sn is melted and diffused into an Ag plate material (including voids). Furthermore, an SiC semiconductor device plated with Sn and a Cu electrode and heat release substrate plated with Sn are disposed on each of both surfaces of an Ag plate material to prepare a laminate, and Sn is melted and diffused into the Ag plate material (including voids) by applying a pressure of 1 MPa for 5 minutes while being heated to 300° C. in a non-oxidizing atmosphere, thereby bonding the semiconductor device and the electrode and heat release substrate.

The bonding member described in Patent Literature 1 has excellent characteristics that the thermal conductivity is 120 W/m·K or more and the electrical conductivity is 50% IACS or more after a heat cycle test in which cooling to −40° C. and heating to 300° C. are repeated 300 times. This is considered to be because thermal stress was relaxed by voids existing inside the bonding member.

Conventionally, in order to evaluate characteristics of a bonding member, a heat test in which a test piece obtained by bonding a semiconductor device and an electrode and heat release substrate by means of a bonding member is put in an oven and heated, and a heat cycle test in which heating and cooling are repeated every 30 minutes are performed. However, the temperature rise during the operation of the semiconductor device in the actual IGBT occurs in several seconds after supply of electric current, and the temperature of the bonding part rises more rapidly than heating by an oven. Therefore, a method of reproducing a temperature rise by current supply between the semiconductor device and the electrode and heat release substrate and performing evaluation by a power cycle test in which heating in seconds and cooling in tens of seconds are repeated is close to an actual operation. For this reason, in particular, in a case where a semiconductor module having a high operation temperature is assumed, it is regarded as a problem that even if the semiconductor module passes a heat keep test or a heat cycle test in which the semiconductor module is heated in an oven, the semiconductor module fails a power cycle test. As described above, the bonding member described in Patent Literature 1 has excellent characteristics that the thermal conductivity is 120 W/m·K or more and the electrical conductivity is 50% IACS or more after the heat cycle test. However, when a power cycle test in which heating to 300° C. and cooling to 25° C. are repeated is performed this time, the bonding member deteriorates due to fatigue, and the thermal conductivity and the electrical conductivity decrease. Moreover, it was found that cracking or breakage of the bonding part occurred.

An object of the present invention is to provide a bonding member that can be used for bonding a semiconductor device in which a highest operation temperature of a semiconductor module reaches 300° C., and an electrode and heat release substrate, and has sufficient resistance to current supply between the semiconductor device and the electrode and heat release substrate.

Solution to Problem

Conventionally, the melting point of a bonding member has been used as an index of heat resistance, but the present inventors have found that in Pb-based, Sn-based, or Au-based solder, although the melting point is 200° C. or higher, when a heat test is performed at a temperature of 200° C. or higher and lower than the melting point, the micro-structure of the material changes and deteriorates. The present inventors have also found that, though bonding strength before and after the heat test has been used as an index, it is merely a reference, and when there is a difference in linear expansion coefficient between members bonded by these solders, deterioration becomes larger. Furthermore, as described in Non Patent Literature 2, even in a member obtained by sintering Ag nano-particles having a melting point of 960° C. or higher, deterioration derived from unsintered parts of secondary particles and microvoids generated by unsintering in a power cycle test at 225° C. occurs. Moreover, as described above, even in the bonding member described in Patent Literature 1, a problem was revealed in the power cycle test at 300° C. Therefore, these cannot be used as bonding members corresponding to semiconductor devices operating at 300° C. Other various inventions have been made, but none have been found that can be used to bond semiconductor devices having a highest operation temperature of 300° C. (for example, Patent Literatures 3 and 4).

Furthermore, in order to efficiently release the heat generated in the semiconductor device to the electrode and heat release substrate, the thermal conductivity of the bonding member needs to be sufficiently high. In order to incorporate an IGBT in a motor of an electric vehicle or the like, a development target of downsizing an IGBT to about 1/10 of an initial model is shown. Semiconductor devices have already been downsized to about 1/5 of conventional ones. The highest operation temperature of a semiconductor device in a semiconductor module using high-temperature Pb-based solder as a bonding member is said to reach 175° C. at highest, but is generally about 150° C.

The thermal conductivity of the catalog value of the Pb-based solder is about 23 W/m·K (20 W/m·K according to the present inventors' measurement). Assuming that the heat generated in the semiconductor device is double the conventional heat and the heat is released through 1/5 of conventional bonding area (i.e. the contact area between the semiconductor device and the bonding member), the value of the thermal conductivity required for a new bonding member is at least 20 W/m·K×2×5=200 W/m·K. This is almost the same as the thermal conductivity of the bonding member using Ag nano-particles. As described above, in many of conventional die bonds, the bonding strength was evaluated after the heat test or the heat cycle test, but in the present invention, the requirement is set so that the thermal conductivity after the power cycle test is 200 W/m K or more because it is actually required in the IGBT or the like.

As described above, since the difference in linear expansion coefficient between the semiconductor device and the electrode and heat release substrate is large, thermal stress is generated between the semiconductor device and the electrode and heat release substrate. If the factor of the thermal stress generated due to the difference in linear expansion coefficient is considered alone, it seems preferable that the linear expansion coefficient of the solder of the bonding member or the nano-Ag is a value between the semiconductor device and the electrode and heat release substrate. However, conventionally, thermal stress is relaxed by solder having a linear expansion coefficient larger than that of Cu, and a semiconductor device and an electrode and heat release substrate are bonded by solder having a thickness of 10 μm or more. Furthermore, in a high-performance IGBT, the semiconductor device and the electrode and heat release substrate are bonded by solder having a thickness of 30 to 300 μm (often 50 to 150 μm). Therefore, the present inventors thought that thermal stress may be relaxed by another characteristic more significant than the linear expansion coefficient, and have come up with the concept of using a stress relieving layer made of Ag which is a metal having flexibility (i.e. the Young's modulus is small) and high thermal conductivity.

The present invention made in order to solve the above problems is a bonding member used for bonding a semiconductor device and a substrate, the bonding member including:

a thermal stress relieving layer made of any of Ag, Cu, Au, and Al;

a first Ag brazing material layer containing Ag and Sn as main components and provided on a side of the thermal stress relieving layer to which the semiconductor device is bonded;

a second Ag brazing material layer containing Ag and Sn as main components and provided on a side of the thermal stress relieving layer to which the substrate is bonded;

a first barrier layer made of Ni and/or Ni alloy and provided between the stress relieving layer and the first Ag brazing material layer; and a second barrier layer made of Ni and/or Ni alloy and provided between the stress relieving layer and the second Ag brazing material layer, in which the thermal conductivity is 200 W/m·K or more after a power cycle test in which heating to 300° C. by current supply and cooling to 25° C. are repeated 30,000 times.

The present inventors closely analyzed the defects that occurred in a heat keep test, a heat cycle test, and a power cycle test of a conventional bonding member, and scrutinized a phenomenon that occurred in a bonding part. Then, the modes in which the bonding part was broken in the power cycle test were classified into breakage occurring at the interface between the semiconductor device and the bonding member and/or the interface between the bonding member and the electrode and heat release substrate (failure mode 1), and breakage occurring inside the bonding member (failure mode 2). It has been found that most of the failure mode 1 occurs at the interface between the semiconductor device and the bonding member, and rarely occurs at the interface between the bonding member and the electrode and heat release substrate. This is considered to be because the linear expansion coefficients of the bonding member and the electrode and heat release substrate are relatively close to each other, and both of the bonding member and the electrode and heat release substrate are made of a material softer than SiC or the like constituting the semiconductor device. In conventional bonding members such as solder, sintered bodies of Ag nano-particles, and bonding members described in Patent Literature 1, these two failure modes have been basically solved with a single composition or structure.

The present inventors have investigated a cause of a problem that has occurred in the power cycle test performed on the bonding member described in Patent Literature 1. As a result, when the test piece is heated to 300° C. by current supply from the substrate to the semiconductor device, a large electric current corresponding to the amount of heat flows through the entire bonding member in a short time. Then, it was found that degradation occurred at locally weak part such as the interface of the bonding member or inside the bonding member, and breakage at a part of the bonding interface between the semiconductor device and the bonding member (failure mode 1) and breakage inside the bonding member (failure mode 2) occurred. It was confirmed that these breakage sites were locally weak parts in the interface or inside of the bonding member in which voids were formed and the structure became thin, or intermetallic compounds of Ag and Sn were aggregated.

As described above, the failure mode 1 occurs mostly at the interface between the semiconductor device and the bonding member. This is considered to be because the high-temperature heat generated when the semiconductor device is working is first transmitted as the impact of the thermal transient, and the load is applied to the bonding member since the material constituting the semiconductor device is not flexible. Therefore, it is necessary to note these points. Furthermore, it is necessary to bond the semiconductor device under the condition that the semiconductor device will not be destroyed. In a SiC semiconductor device, breakage of the semiconductor device does not occur at a temperature of about 450° C. and a pressure of about 30 MPa, but in order to more reliably avoid breakage of the semiconductor device, it is preferable that the semiconductor device is bonded at a temperature of 430° C. or less and a pressure of 15 MPa or less. It is also preferable that the bonding time does not exceed 60 minutes. In studying the present invention, it was considered to use Ag nano-particles instead of the Ag brazing material, but it was found that a bonding member using a sintered body of Ag nano-particles did not pass the power cycle test at 225° C. or higher. Based on the results, the present inventors have focused on improving the Ag brazing material in Patent Literature 1. The invention described in Patent Literature 1 has led to a bonding technique that passes the heat cycle test at 300° C., but this bonding member does not pass the power cycle test at 300° C.

The Ag brazing material is a conventionally known material. For example, in an IGBT module, a Ti-containing Ag brazing material or the like, which is a kind of Ag brazing material, is used when a semiconductor device is bonded to a direct bonded cupper (DBC), which is an insulating circuit board in which Cu having excellent conductivity is provided as a circuit layer on a surface of an insulating ceramic substrate (63Ag35Cu1Sn-balance-Ti melting method; brazing temperature 800° C.). The thermal conductivity of this brazing material is 170 W/m·K, which is higher than the thermal conductivity of the high-temperature Pb-based solder or the Sn-based solder (23 to 49 W/m·K). As another type of Ag brazing material, for example, BAg-18 (melting method 60Ag30Cu10Sn), which is one of Ag brazing materials specified in JIS Z 3261, has high thermal conductivity. Furthermore, a AgSn alloy obtained by removing Cu from BAg-18 also has high thermal conductivity. These Ag brazing materials are considered to have good bondability with metals of Cu, Ni, Ag, and Au. However, the brazing temperature of the Ag brazing material or the like is as high as 720 to 840° C., and the semiconductor device is destroyed by heat. On the other hand, the thermal conductivity of the bonding member obtained by transition-sintering a low Ag content of less than 50 wt % was low, and the bonding strength was also low. In particular, in the bonding member obtained by transition-sintering the Ag powder and the Sn powder, instability of bonding due to voids and a decrease in thermal conductivity were clearly observed.

Solder and Ag brazing material are both a type of brazing material. In general, a solder is considered to have the melting point or the bonding temperature of 450° C. or lower, and brazing material is considered to have the melting point or bonding temperature of 450° C. or higher. Furthermore, brazing material containing 50 wt % or more of Ag is called Ag brazing material. In the present specification, brazing material having Ag content of 50 wt % or more is referred to as Ag brazing material. The Ag brazing material has high heat resistance and high thermal conductivity, but the bonding temperature (or the melting point of the Ag brazing material) is 450° C. or higher, which is so high that the semiconductor device may be destroyed.

As described above, the bonding (brazing) temperature of the Ag brazing material is high, and the Ag brazing material cannot be used for bonding semiconductor devices by melting. However, as described in Patent Literature 1, if a liquid phase diffusion method in which Sn is melted and diffused into Ag is used, an Ag brazing material layer can be formed on the bonding surface of the semiconductor device at a low temperature of about 300° C. The low-temperature bonding Ag brazing that can be bonded under conditions that do not destroy semiconductor devices is a promising bonding method for solving the failure mode 1.

Advantageous Effects of Invention

In the bonding member according to the present invention, the failure mode 1 is eliminated by improving the Ag brazing material. Furthermore, the failure mode 2 is eliminated by using a thermal stress relieving layer made of pure Ag or the like. This makes it possible to further increase the thermal conductivity. By combining these, the invention of the bonding material that passes the power heat cycle test at 300° C. has been achieved. The total thickness of the first Ag brazing material and the second Ag brazing material is preferably 10% or less of the total thickness of the bonding member.

As described above, the bonding member described in Patent Literature 1 can be manufactured from Ag powder and Sn powder by bonding under a condition that the semiconductor device is not broken by the liquid phase diffusion method, and passes the heat cycle test at 300° C. However, a weak part caused by voids provided for relaxing the thermal stress became a starting point, and was degraded and failed in the power cycle test.

When a bonding member is made of a single material, even a flexible material needs to have a certain thickness in order to alleviate thermal stress generated between the semiconductor device and the electrode and heat release substrate which have a large difference in linear expansion coefficient. On the other hand, in the present invention, the thermal stress is relaxed by the thermal stress relieving layer made of pure Ag. Therefore, it is not necessary to relax the thermal stress by the first brazing material layer and the second brazing material layer, and it is only necessary to bond the semiconductor device and the electrode and heat release substrate, so that the thickness can be reduced.

AgSn brazing material constituting the first brazing material layer and the second brazing material layer exhibits excellent bondability to Ag, Cu, Au, and Al. Furthermore, as described later, by preparing Ag brazing material from Ag foil, Sn foil or the like by a liquid phase diffusion method, voids can be reduced, so that weak parts can be reduced and bonding reliability can be improved. Moreover, since the first brazing material layer and the second brazing material layer can be made thin as described above, the gas easily escapes during preparation even at a small load, and the internal voids can be suppressed to 5 vol % or less. Then, generation of voids can be suppressed as compared with the case of using Ag powder or Sn powder as in Patent Literature 1. Even in a bonding member made of a general solder or Ag brazing material, when voids are present at an amount of 5 vol % or more, there is a high possibility that separation or breakage occurs.

By suppressing the generation of voids as described above, the thermal conductivity of the first Ag brazing material layer and the second Ag brazing material layer can be increased (the decrease in thermal conductivity due to voids can be suppressed). For example, 65Ag35Sn (Ag brazing material composed of 65 wt % Ag and 35 wt % Sn) had a thermal conductivity of 110 W/m·K (for reference, the thermal conductivity of Ni is 90 W/m·K).

Furthermore, in the bonding member according to the present invention, the failure mode 2 is eliminated by using the thermal stress relieving layer made of any one of Ag, Cu, Au, and Al, and resistance to the power cycle test at 300° C. is imparted. When the semiconductor device and the electrode and heat release substrate are bonded to each other by AgSn brazing material by the liquid phase diffusion method, Sn may be diffused into the thermal stress relieving layer to change the composition of the thermal stress relieving layer, or voids may be generated in the thermal stress relieving layer. In the present invention, by providing a barrier layer made of Ni or Ni alloy, diffusion of Sn into the thermal stress relieving layer is suppressed.

Since the bonding member according to the present invention includes the thermal stress relieving layer made of any one of Ag, Cu, Au, and Al, the Ag brazing material layers mainly composed of Ag and Sn, and barrier layers made of Ni and/or Ni alloy, the bonding member has sufficient resistance to current supply, and has a thermal conductivity of 200 W/m·K or more as a whole even after the power cycle test is performed. As described above, the bonding member according to the present invention can be used for bonding a semiconductor device, in which the highest operation temperature reaches 300° C., and an electrode and heat release substrate of a semiconductor module, and has sufficient toughness against failure due to current supply between the semiconductor device and the electrode and heat release substrate.

In the bonding member according to the present invention, as described above, the thermal stress relieving layer made of Ag or other metals is used in order to avoid breakage occurring inside the bonding member (failure mode 2). For the thermal stress relieving layer, flexible material is effective, and rubber or resin meets the requirements. Young's modulus is known as an index representing physical characteristics related to flexibility of a material, and for example, Patent Literatures 3 and 4 refer to Young's modulus of bonding materials. Solder is an alloy of Pb and Sn, and has a low Young's modulus of 17 to 68 GPa, but its thermal conductivity is low, and the structure changes and deteriorates in the heat test at 200° C. or higher. On the other hand, in the present invention, the thermal stress relieving layer is made of Ag or other metals having high thermal conductivity. For example, the Young's modulus of pure Ag is 73 GPa, which is smaller than the Young's modulus of SiC (410 GPa) and the Young's modulus of Cu (120 GPa). Therefore, the thermal stress generated between the semiconductor device and the electrode and heat release substrate is relieved owing to the deformation of the thermal stress relieving layer made of Ag or other metals. Furthermore, since the thermal conductivity of Ag is as high as 420 W/m·K, heat generated from the semiconductor device can be efficiently released to the substrate. It is also possible to further reduce the Young's modulus by using a skeleton in which voids are formed (a member whose framework is made of pure Ag, etc. other than Ag nano-particles. For example, a plate of pure Ag, etc. with voids formed inside).

BRIEF DESCRIPTION OF DRAWINGS

FIG. 1 is a schematic diagram illustrating a state in which a semiconductor device and an electrode and heat release substrate are bonded by a semiconductor device bonding member according to an embodiment of the present invention.

DESCRIPTION OF EMBODIMENTS

A semiconductor device bonding member according to the present invention has a configuration having a function corresponding to each of the failure mode 1 and the failure mode 2 occurring at a bonding part between a semiconductor device and an electrode and heat release substrate in a semiconductor module. Solder, nano-Ag, and the bonding member described in Patent Literature 1, which are conventional bonding members, all bond the semiconductor device and the electrode and heat release substrate with a single member. On the other hand, in the present invention, a member corresponding to each failure mode is prepared, and these members are combined to solve the problem.

The requirements of the semiconductor device bonding member according to the present invention are as described above, but the technical idea can be applied to a wider range. Specifically, for example, a material constituting the barrier layer can be made of Co or Co alloy. That is, a semiconductor device bonding member extending the technical idea of the present invention can be expressed as a semiconductor device bonding member including:

a thermal stress relieving layer made of one or more of Ag, Cu, Au, and Al;
a first Ag brazing material layer containing Ag and Sn as main components and provided on a side of the thermal stress relieving layer to which the semiconductor device is bonded;
a second Ag brazing material layer containing Ag and Sn as main components and provided on a side of the thermal stress relieving layer to which the substrate is bonded;
a first barrier layer made of Ni, Co, and/or alloy of Ni and/or Co, and provided between the stress relieving layer and the first Ag brazing material layer; and
a second barrier layer made of Ni, Co, and/or alloy of Ni and/or Co, and provided between the stress relieving layer and the second Ag brazing material layer,
in which a thermal conductivity is 200 W/m·K or more after a power cycle in which heating to 300° C. by current supply is repeated 30,000 times. In consideration of Young's modulus (73 GPa), thermal conductivity (420 W/m·K), electrical conductivity (volume resistivity 1.6 μΩ·cm), cost required for acquisition, and the like, it is most preferable to use the thermal stress relieving layer made of Ag. Furthermore, from the viewpoint of more reliably suppressing diffusion of Sn into the thermal stress relieving layer, each of the first barrier layer and the second barrier layer is preferably made of Ni and/or Ni alloy. Moreover, from the viewpoint of increasing the thermal conductivity of the entire bonding member, the total thickness of the first Ag brazing material layer and the second Ag brazing material layer is preferably 10% or less of the thickness of the entire bonding member, and the first Ag brazing material layer and the second Ag brazing material layer preferably contain 50 wt % or more of Ag. It is more preferable that the first Ag brazing material layer and the second Ag brazing material layer contain 60 wt % or more of Ag.

Hereinafter, a specific embodiment and examples of the semiconductor device bonding member according to the present invention will be described. A semiconductor device bonding member 10 of the present embodiment is a member used for so-called die bonding, and is used for bonding a semiconductor device 20 to a substrate such as an electrode and heat release substrate 30 as illustrated in FIG. 1. The semiconductor device 20 is typically made of SiC, and the electrode and heat release substrate 30 is made of Cu. The semiconductor device bonding member 10 of the present embodiment includes a thermal stress relieving layer 11, a first Ag brazing material layer 12 formed on a front surface (a side of the semiconductor device 20), a second Ag brazing material layer 13 formed on a back surface (a side of the electrode and heat release substrate 30), a first barrier layer 14 provided between the stress relieving layer 10 and the first Ag brazing material layer 12, and a second barrier layer 15 provided between the stress relieving layer 10 and the second Ag brazing material layer 13. The entire thickness of the semiconductor device bonding member 10 of the present embodiment is 10 μm or more and 300 μm or less. When the thickness is smaller than 10 μm, it is difficult to sufficiently alleviate the thermal stress generated between the semiconductor device 20 and the electrode and heat release substrate 30. On the other hand, when the thickness is larger than 300 μm, the thermal resistance of the entire semiconductor device bonding member increases, and the efficiency of releasing heat from the semiconductor device decreases. Note that, in FIG. 1, the size and thickness of each part are appropriately adjusted to facilitate understanding of an arrangement of each part.

Hereinafter, each part constituting the bonding member of the present embodiment will be described.
(Semiconductor Device of Member to be Bonded)

In the semiconductor device 20 of a general IGBT, an electrode and bonding layer 21 made of Ni (for other special products, Co, Ag, Cu, or multilayer may be used.) and also serving as an electrode and a bonding layer is provided on a bonding surface of the semiconductor device. In many cases, the electrode and bonding layer 21 is only one layer made of Ni or Ni alloy, but in some cases, an antioxidant layer such as a thin Ag layer or Au layer is further provided in order to prevent oxidation of Ni. Even when these antioxidant layers are provided, in the present embodiment, the metal constituting the antioxidant layer diffuses into the Ag brazing material layer 12 at the time of bonding and becomes a part of the Ag brazing material layer. Ni and Ag hardly form a solid solution with each other, but when Sn is present, Ag and Ni react with each other via Sn. Therefore, the Ag brazing material layer 13 may contain an alloy containing other elements such as Ni, or Ag or Au constituting the antioxidant layer, or an alloy of Ag or Au.
(Electrode and Heat Release Substrate of Member to be Bonded)

The electrode and heat release substrate 30 is basically made of Cu or Cu alloy. When used at a high temperature, it is desirable to provide an antioxidant layer such as Ni or Ni alloy in order to prevent oxidation. In the present embodiment, a bonding surface of the electrode and heat release substrate 30 is subjected to electroless plating with Ni.
(First Ag Brazing Material Layer and Second Ag Brazing Material Layer)

The thermal stress relieving layer 11 made of pure Ag and the Ni layer 21 provided on the bonding surface of the semiconductor device 20 can be bonded to the first Ag brazing material layer 12 under the condition that the semiconductor device 20 is not broken, and the condition that the first Ag brazing material layer passes the power cycle test at 300° C. is required to be satisfied. In the bonding member described in Patent Literature 1, since the semiconductor device is bonded at a low temperature, breakage of the semiconductor device can be avoided. However, fatigue deterioration caused by voids provided for relaxing thermal stress has occurred. In the semiconductor device bonding member 10 of the present embodiment, the thermal stress relieving layer 11 is provided separately from the first Ag brazing material layer 12 and the second Ag brazing material layer 13, and since the thermal stress is relaxed by the thermal stress relieving layer 11, it is not necessary to provide voids inside the first Ag brazing material layer 12 and the second Ag brazing material layer 13. Furthermore, these layers can be thinned. It is preferable that the thicknesses of the first Ag brazing material layer 14 and the second Ag brazing material layer 15 are appropriately adjusted in a range of 10 μm or less in total. When the thickness of the first Ag brazing material layer and the second Ag brazing material layer are larger than 10 μm, voids and aggregation of metal compounds are likely to occur. Furthermore, in order to increase the thermal conductivity of the entire semiconductor device bonding member 10, the total thickness of the 1Ag brazing material layer 12 and the second Ag brazing material layer 13 is desirably suppressed to 10% or less of the total thickness of the bonding member 10.

When the Ag brazing material layer is formed, an Ag foil and an Sn foil each having a thickness corresponding to a required composition ratio are used. The present inventors have found that by using foils of Ag and Sn in a vacuum and increasing the temperature and load in the Ag brazing material layer in order to require bonding reliability with a thin layer, a gas generated when Sn is melted is easily released, and a sufficiently thin layer with few voids can be produced, and further, bonding can be performed at 450° C. or lower at which a semiconductor device is not broken, and for example, even a 65Ag35Sn alloy (Ag brazing material) has a thermal conductivity of 110 W/m·K, and a thin Ag brazing material layer with few defects and few voids of 5 vol % or less can be produced.

The AgSn-based Ag brazing material has good wettability with Cu, Ag, Ni, and Au, and high bonding reliability can be obtained. At the time of bonding, a metal constituting a layer provided on the surface of these materials for bondability and oxidation resistance may react with Ag or Sn, but if the Ag brazing material is 50 wt % Ag or more, a sufficiently high thermal conductivity can be secured even when such a reaction occurs.

The Ag brazing material layer can be produced, for example, by superposing an Ag foil and an Sn foil, and heating and pressurizing them. Alternatively, it can also be prepared by forming a very thin film of Ag and Sn by sputtering, plating, or the like, or by providing a thick foil, plate, or the like and heating and pressurizing the film on the surfaces of the semiconductor device 20 and the electrode and heat release substrate 30, which are members to be bonded, and the members constituting the thermal stress relieving layer 11. Moreover, it can also be prepared by providing a part or all of the Ag layer and the Sn layer on the member to be bonded and heating and pressurizing the Ag layer and the Sn layer. Note that the composition and thickness of the first Ag brazing material layer 12 and the second Ag brazing material layer 13 are not necessarily the same.

(Thermal Stress Relieving Layer)

In the bonding member 10 of the present embodiment, the thermal stress relieving layer 11 made of Ag or the like is used in order to avoid breakage (failure mode 2) occurring inside the bonding member 10. The thermal stress relieving layer 11 is preferably a plate material or foil of pure Ag that is flexible (has a low Young's modulus) and has a high thermal conductivity. Alternatively, in a case where the large-sized semiconductor device 20 or the extra-large electrode and heat release substrate 30 is bonded, a skeleton in which voids of 40 vol % or less are formed in order to further reduce the Young's modulus may be used as the thermal stress relieving layer 11. However, when the voids are 40 vol % or more, the thermal stress relieving layer is buckled at the time of bonding.

Since the Young's modulus of Ag is 73 GPa and is smaller than the Young's modulus of SiC (410 GPa) and the Young's modulus of Cu (120 GPa), the thermal stress generated between the semiconductor device 20 and the electrode and heat release substrate 30 is relaxed by deformation of the thermal stress relieving layer 11 made of Ag. Furthermore, since the thermal conductivity of Ag is as high as 420 W/m·K, heat generated from the semiconductor device 20 can be efficiently released to the substrate. In the bonding member described in Patent Literature 1, internal fracture occurs due to generation of an intermetallic compound with Sn in Ag. A plate material of pure Ag is formed by melting and rolling at a temperature higher than or equal to the melting point of Ag of 960° C., and therefore even when the power cycle test at 300° C. is performed, no change due to fatigue degradation is observed at all. Furthermore, since a skeleton having a space inside a plate seat of pure Ag is also produced by heat sintering at about 900° C., no change due to fatigue degradation is observed even when the power cycle test at 300° C. is performed.

(First Barrier Layer, Second Barrier Layer)

When the first Ag brazing material layer 12 and the second Ag brazing material layer 13 are provided directly on a surface layer of the pure Ag plate material constituting the thermal stress relieving layer 11, Sn contained in these brazing material layers easily reacts with Ag in the thermal stress relieving layer 11, and the Sn easily diffuses into the thermal stress relieving layer 11. As a countermeasure in such a case, a barrier layer made of Ni may be disposed in the field of Ag brazing, and this is also effective in the present embodiment. By disposing the first barrier layer 14 and the second barrier layer 15 on the front and back surfaces of the thermal stress relieving layer 11 in this manner, only pure Ag having low electric resistance is present inside the thermal stress relieving layer 11, and aggregation of an intermetallic compound of Ag and Sn can be prevented to exhibit an original thermal stress relieving effect of Ag. Furthermore, the thermal conductivity inherent to Ag does not decrease or the electrical resistance does not increase. Moreover, the aggregation of the intermetallic compound of Ag and Sn can be prevented. As the thermal stress relieving layer 11, an appropriate material such as a Cu plate material, an Al plate material, or a skeleton provided with a space inside the Cu plate material or the Al plate material can be used as long as required performance and characteristics are satisfied.

(Bonding)

In the present embodiment, the method is not particularly limited as long as the semiconductor device 20 and the electrode and heat release substrate 30 can be bonded at a low temperature of 450° C. or less in order to prevent breakage of the semiconductor device 20. As one of the optimal methods, for example, there is a method in which film-like or foil-like melted Sn is diffusion-reacted with film-like or foil-like Ag to produce an Ag brazing material. In the SiC semiconductor device, it is considered that the semiconductor device is not broken when the temperature is about 450° C. and the pressure is about 30 MPa, but in order to more reliably avoid breakage of the semiconductor device, it is preferable to bond the semiconductor device at a temperature of 400° C. or less and a pressure of 15 MPa or less. Furthermore, the bonding time is preferably not more than 60 minutes. Moreover, considering bonding of a semiconductor device made of Si or GaN, it is more preferable to satisfy the requirements of a temperature of 350° C. or less, a pressure of 5 MPa or less, and a bonding time of 10 minutes or less. The present inventors have improved the Ag brazing material to enable bonding satisfying these requirements. In the present embodiment, in order to solve the problems of the failure modes 1 and 2, the first Ag brazing material layer 12 and the second Ag brazing material layer 13 are bonded to the thermal stress relieving layer 11 at a low temperature as described above. The bonding in the present embodiment is performed in consideration of a bonding technique using solder or a sintered body of Ag nano-particles, and equipment and a production technique used for these can be appropriately applied.

Next, a conventional technique of bonding a semiconductor device (conventional examples), examples corresponding to the above embodiment, and comparative examples in which a part of the configuration of the examples is changed will be described.

In Conventional Examples 1 to 8, bonding of a SiC semiconductor device and a Cu electrode and heat release substrate was attempted using bonding members shown in Table 1. Bonding conditions in each example are also shown.

electrode and heat release substrate, placed in a nitrogen and hydrogen atmosphere, heated to 350° C. and pressurized to 5 MPa for 10 minutes, and bonded.

In Conventional Example 4, a SiC semiconductor device and a Cu electrode and heat release substrate were bonded to each other with a Pb-based solder (95Pb5Sn solder) by heating the SiC semiconductor device and the Cu electrode and heat release substrate to 350° C. and pressurizing the SiC semiconductor device and the Cu electrode and heat release substrate to 1 MPa for 1 minute in a nitrogen and hydrogen atmosphere. The void fraction of the bonding member of Conventional Example 4 is 5 vol % or less.

TABLE 1

| | Bonding member | | | Bonding conditions | | | | | Characteristics evaluation | | Thermal conductivity (W/m · K) |
|---|---|---|---|---|---|---|---|---|---|---|---|
| | Overall thickness (μm) | Material | Void fraction (%) | Bonding method | Atmosphere | Temperature (° C.) | Load (MPa) | Bonding time (min) | Bondability | Power Cycle | |
| Conventional Example 1 | | None | | Heating and pressure bonding method | Ar | 350 | 5 | 10 | x | — | — |
| Conventional Example 2 | 2 | Ag layer (bonding surface of bonded member) | — | Heating and pressure bonding method | N2—H2 | 350 | 5 | 10 | x | — | — |
| Conventional Example 3 | 100 | 60Ag30Cu10Sn | — | Heating and pressure bonding method | N2—H2 | 350 | 5 | 10 | x | — | — |
| Conventional Example 4 | 100 | 95Pb5Sn solder | 5% or less | Heating and pressure bonding method | N2—H2 | 350 | 1 | 1 | ○ | x | — |
| Conventional Example 5 | 100 | Nano-Ag | Unknown | Heating and pressure bonding method | Ar | 350 | 5 | 10 | ○ | x | — |
| Conventional Example 6 | 100 | 80Ag20Sn | 40 | Powder Sn melting reaction bonding method | Ar | 350 | 5 | 10 | ○ | x | — |
| Conventional Example 7 | 10 | 80Ag20Sn | 35 | Powder Sn melting reaction bonding method | Ar | 350 | 5 | 10 | ○ | x | — |
| Conventional Example 8 | 100 | 90Ag10Sn | 7 | Powder Sn melting reaction bonding method | Ar | 400 | 15 | 10 | ○ | x | — |

In Conventional Example 1, a SiC semiconductor device and a Cu electrode and heat release substrate were stacked, directly placed in an argon atmosphere without a bonding member, and directly bonded by heating to 350° C. and pressurizing to 5 MPa for 10 minutes.

In Conventional Example 2, a 1 μm-thick Ag layer (2 μm-thick Ag layer in total) was formed on each of a bonding surface of a SiC semiconductor device and a bonding surface of a Cu electrode and heat release substrate, and placed in a nitrogen and hydrogen atmosphere, and both were bonded by heating to 350° C. and pressurizing to 5 MPa for 10 minutes.

In Conventional Example 3, an Ag brazing material (60Ag30Cu10Sn) having a thickness of 100 μm was sandwiched between a SiC semiconductor device and a Cu In Conventional Example 5, a Ag nano-particle layer having a thickness of 100 μm is provided between bonding surfaces of a SiC semiconductor device and an electrode and heat release substrate, and the SiC semiconductor device and the electrode and heat release substrate are bonded to each other by being placed in an argon atmosphere, heated to 350° C., and pressurized to 5 MPa for 10 minutes.

The thickness of each of the bonding members of Conventional Examples 3 to 5 is 100 μm.

Conventional Examples 6 to 8 correspond to the semiconductor device bonding member proposed by the present inventors in Patent Literature 1.

In Conventional Examples 6 and 7, 80 wt % of Ag powder and 20 wt % of Sn powder were disposed between a SiC semiconductor device and an electrode and heat release substrate, the SiC semiconductor device and the electrode and heat release substrate were placed in a non-oxidizing atmosphere (argon), and Sn was melted and bonded by heating to 350° C. and pressurizing to 5 MPa for 10 minutes.

In Conventional Example 8, 90 wt % of Ag powder and 10 wt % of Sn powder were disposed between a SiC semiconductor device and an electrode and heat release substrate, the SiC semiconductor device and the electrode and heat release substrate were placed in an argon atmosphere, and Sn is melted and bonded by heating to 400° C. and pressurizing to 15 MPa for 10 minutes.

The bonding member of Conventional Example 6 contains 40 vol % of voids, the bonding member of Conventional Example 7 contains 35 vol % of voids, and the bonding member of Conventional Example 8 contains 7 vol % of voids. The thickness of the bonding members of Conventional Examples 6 and 8 is 100 μm, and the thickness of the bonding member of Conventional Example 7 is 10 μm.

For each of the above-described conventional examples, first, the state of the bonded part was visually confirmed, and the bondability was evaluated. In the evaluation of the bondability, a sample in which cracking, chipping, or peeling did not occur in the bonding member or the bonding part was determined to be acceptable. In Conventional Examples 1 to 3, the semiconductor device and the electrode and heat release substrate were not bonded, and only Conventional Examples 4 to 8 passed the evaluation of bondability.

(Power Heat Cycle Test)

A power cycle test was performed on Conventional Examples 4 to 8 that passed the evaluation of bondability. In the power cycle test, a heating and cooling cycle was repeated 30,000 times in which a test piece obtained by bonding a SiC semiconductor device and a Cu electrode and heat release substrate to each other was attached to a large-sized water-cooled cooler using thermal grease, the semiconductor device 20 and the electrode and heat release substrate 30 were supplied current for 3 seconds to be heated to 300° C., and then the semiconductor device and the electrode and heat release substrate were cooled to 25° C. for 30 seconds by the cooler. When an abnormal voltage or electric current occurred during the test, continuation of the test was dangerous, and the test was stopped. When a crack or breakage occurred in a cross section of the test piece, the test piece was determined to be unacceptable. Basically, the thermal conductivity after the power cycle test of 30,000 times was measured, and those having a thermal conductivity of 200 W/m·K or less were determined to be unacceptable. This makes it possible to capture a change that does not appear in the power cycle test (for example, Non Patent Literatures 4 to 6). All of Conventional Examples 4 to 8 failed in the power cycle test. Note that, as in Examples described later, the following thermal conductivity measurement was performed for a test piece that passed the power cycle test.

(Measurement of Thermal Conductivity)

For the test piece that passed the power heat cycle test, the thermal conductivity was measured by a laser flash method using FTC-RT manufactured by Advanced Riko Co., Ltd. In the laser flash method, the surface of the sample is irradiated with pulsed laser light and instantaneously heated, and a process in which the heat of the surface is diffused to the back surface of the sample with the lapse of time is observed as a time change in the temperature of the back surface of the sample. The standard sample in this measurement method is a circular piece having a diameter of 10 mm and a thickness of 1 mm, or a square piece having 10 mm square shape and 1 mm in thickness. This test piece was obtained by bonding a 10 mm square, 1 mm thick Cu electrode and heat release substrate and a 5 mm square, 0.35 mm thick SiC semiconductor device with a 5 mm square, 11 to 100 μm thick bonding member. In order to correct the difference from the dimension of the standard sample in the laser flash method, the thermal conductivity of the bonding member was calculated based on the measurement results of the Cu electrode and heat release substrate and the SiC semiconductor device having the same shape as the test piece and the measurement results of the test pieces of the Examples described later.

As can be seen from the results shown in Table 1, when the SiC semiconductor device and the Cu electrode and heat release substrate were bonded by the conventional technique, there is no piece which passes all the evaluations (tests). SiC semiconductor devices operating at 300° C. are required to have a sufficient thermal conductivity even after the power cycle test in addition to the above test, but all the test pieces failed before the evaluation.

Next, a test piece (hereinafter, it is simply referred to as "Example 1" or the like.) in which a semiconductor device and an electrode and heat release substrate are bonded to each other by a bonding member of an example according to the present embodiment and a comparative example prepared based on the above results will be described. Table 2 shows the configuration of the bonding member and bonding conditions in each example. The thickness of the brazing material layer in Table 2 is the sum of the thicknesses of the first Ag brazing material layer 12 and the second Ag brazing material layer 13. In Examples 1 to 11, the same Ag brazing material layer was used as the first Ag brazing material layer 12 and the second Ag brazing material layer 13, but the first Ag brazing material layer 12. However, the second Ag brazing material layer 13 may differ from each other.

TABLE 2

| | | Bonding member | | | | | | | | | | | | |
|---|---|---|---|---|---|---|---|---|---|---|---|---|---|---|
| | | Bonding layer with SiC/Cu (Ag brazing material layer) | | | Thermal stress relieving layer | | | Barrier layer (Ni, 1 μm for each of upper and lower) | Bonding conditions | | | | | Characteristics evaluation | |
| | Overall thickness (μm) | Material (Main component) | Total thickness (μm) | Void fraction (%) | Material | Thickness (μm) | Void fraction (%) | | Bonding method | Atmosphere | Temperature (° C.) | Load (MPa) | Time (min) | Bondability | Power Cycle | Thermal conductivity (W/m·K) |
| Example 1 | 100 | 80Ag20Sn | 10 | 5% or less | Ag plate | 88 | 0 | Presence | Low-temperature Ag | Vacuum | 350 | 5 | 10 | ○ | ○ | 329 |
| Example 2 | 100 | 80Ag20Sn | 5 | 5% or less | Ag plate | 93 | 0 | Presence | Low-temperature Ag | Vacuum | 350 | 5 | 10 | ○ | ○ | 340 |

TABLE 2-continued

| | Bonding member | | | | | | | | | | | | | Characteristics evaluation | | |
|---|---|---|---|---|---|---|---|---|---|---|---|---|---|---|---|---|
| | Bonding layer with SiC/Cu (Ag brazing material layer) | | | | Thermal stress relieving layer | | Barrier layer (Ni, 1 µm for each of upper and lower) | Bonding conditions | | | | | | | | Thermal conductivity (W/m·K) |
| | Overall thickness (µm) | Material (Main component) | Total thickness (µm) | Void fraction (%) | Material | Thickness (µm) | Void fraction (%) | | Bonding method | Atmosphere | Temperature (° C.) | Load (MPa) | Time (min) | Bondability | Power Cycle | |
| Example 3 | 100 | 80Ag20Sn | 5 | 5% or less | Ag plate | 93 | 20 | Presence | brazing material bonding method | Vacuum | 350 | 5 | 10 | ○ | ○ | 272 |
| Example 4 | 100 | 80Ag20Sn | 5 | 5% or less | Ag plate | 93 | 40 | Presence | | Vacuum | 350 | 5 | 10 | ○ | ○ | 209 |
| Example 5 | 300 | 80Ag20Sn | 5 | 5% or less | Ag plate | 293 | 0 | Presence | | Vacuum | 350 | 5 | 10 | ○ | ○ | 357 |
| Example 6 | 11 | 80Ag20Sn | 1 | 5% or less | Ag plate | 8 | 20 | Presence | | Vacuum | 350 | 5 | 10 | ○ | ○ | 266 |
| Example 7 | 100 | 80Ag20Sn | 0.5 | 5% or less | Ag plate | 97.5 | 10 | Presence | | Vacuum | 350 | 5 | 10 | ○ | ○ | 354 |
| Example 8 | 100 | 90Ag5Sn | 5 | 5% or less | Ag plate | 93 | 0 | Presence | | Vacuum | 350 | 5 | 10 | ○ | ○ | 333 |
| Example 9 | 100 | 90Ag5Sn | 5 | 5% or less | Ag plate | 93 | 0 | Presence | | Vacuum | 400 | 10 | 10 | ○ | ○ | 351 |
| Example 10 | 100 | 70Ag30Sn | 1 | 5% or less | Ag plate | 97 | 0 | Presence | | Vacuum | 350 | 5 | 10 | ○ | ○ | 265 |
| Example 11 | 100 | 60Ag40Sn | 1 | 5% or less | Ag plate | 97 | 0 | Presence | | Vacuum | 350 | 5 | 10 | ○ | ○ | 240 |
| Example 12 | 100 | 80Ag20Sn | 5 | 5% or less | Cu plate | 93 | 30 | Presence | | Vacuum | 350 | 5 | 10 | ○ | ○ | 223 |
| Example 13 | 100 | 80Ag20Sn | 1 | 5% or less | Al plate | 97 | 0 | Presence | | Vacuum | 350 | 1 | 10 | ○ | ○ | 208 |
| Comparative Example 1 | 100 | 70Ag30Sn | 2 | 5% or less | Ag plate | 98 | 0 | Absence | | Vacuum | 350 | 5 | 10 | ○ | x | — |
| Comparative Example 2 | 100 | 80Ag20Sn | 10 | 5% or less | Ag plate | 90 | 20 | Absence | | Vacuum | 350 | 5 | 10 | ○ | x | — |
| Comparative Example 3 | 100 | 80Ag20Sn | 10 | 5% or less | Ag plate | 88 | 50 | Presence | | Vacuum | 350 | 5 | 10 | x | — | — |
| Comparative Example 4 | 100 | 80Ag20Sn | 15 | 5% or less | Ag plate | 83 | 20 | Presence | | Vacuum | 350 | 5 | 10 | ○ | x | — |
| Comparative Example 5 | 100 | 80Ag20Sn | 15 | 5% or less | Ag plate | 83 | 20 | Presence | | Vacuum | 400 | 10 | 10 | x | — | — |
| Comparative Example 6 | 100 | 80Ag20Sn | 5 | 5% or less | Nano-Ag | 93 | Unknown | Presence | | Vacuum | 350 | 5 | 10 | ○ | x | — |

In each of Examples 1 to 13, a SiC semiconductor device and an electrode and heat release substrate were bonded to each other by a semiconductor device bonding member prepared by the above-described bonding method (low-temperature Ag brazing material bonding method in which Sn foil or layer is melted and diffusion-reacted in Ag foil or Ag layer) under conditions of a temperature of 350° C. (the heating temperature was set to 350° C. higher than 300° C. which is a heating temperature in the power heat cycle test.), a pressure of 5 MPa (10 MPa in Example 9), and a retention time of 10 minutes in a vacuum atmosphere.

Preparation and evaluation steps of Example 1, which is an example of the present embodiment, are as follows. The preparation and evaluation steps are the same for Example 2 to 13 (the thickness and the like of each member are different individually).

Preparation Step 1; A (commercially available) SiC semiconductor device (5 mm square, 0.35 mm thick) in which a Ni layer having a thickness of 1 µm is formed on a bonding surface is prepared.

Preparation Step 2; A (commercially available) electroless Ni plated 1 µm Cu plate material (10 mm square, 1 mm thick) in which a Ni layer having a thickness of 1 µm is formed on a bonding surface is prepared.

Preparation Step 3; A layered product by forming Ni layers (barrier layers) each having a thickness of 1 µm on upper and lower surfaces of an Ag plate material having a thickness of 88 µm, and providing Ag foils and Sn foils each having a thickness corresponding to the contents of Ag and Sn in each Example (in Example 1, 80 wt % of Ag and 20 wt % of Sn) on the surface of each Ni layer.

Preparation Step 4; The SiC semiconductor device, the laminate, and the Cu plate material are stacked and set in a hot press machine.

Preparation Step 5; In the hot press machine, the sample is held at a temperature of 350° C. and a pressure of 5 MPa (10 MPa only in Example 9) for 10 minutes in a vacuum atmosphere.

Evaluation Step 1; Two test pieces are produced by the preparation steps 1 to 5, and the bonding state is checked to evaluate the bondability. Then, 1 sample was heated to 500° C. and held for 30 minutes, and it was confirmed whether there was a problem in heat resistance. If there is no problem in heat resistance, the power heat cycle test at 300° C. is performed using the remaining one.

Evaluation Step 2; The thermal conductivity of the test piece that passed the power heat cycle test at 300° C. is measured by the laser flash method.

All of Examples 1 to 13 described above passed the bondability, heat resistance, and power cycle test. Moreover, as a result of measuring the thermal conductivity by the laser flash method performed after the power cycle test, the thermal conductivity was 200 W/m·K or more in all of Examples 1 to 11.

On the other hand, among Comparative Examples 1 to 4 prepared by changing any parameter from Examples 1 to 11, Comparative Example 3 had poor bondability, and all of other Comparative Examples 1, 2, and 4 failed in the power cycle test.

Each of the above embodiment and examples is an example, and may be appropriately changed in accordance with the gist of the present invention. For example, although the above-described embodiment and examples have a configuration including a single thermal stress relieving layer, a structure in which a plurality of thermal stress relieving layers are laminated with an Ag brazing material layer interposed therebetween can also be adopted. In this case, the plurality of thermal stress relieving layers are not limited to the same material, and some or all of the thermal stress relieving layers may be made of different materials. Furthermore, in the above embodiment, the thickness of each of the first barrier layer 14 and the second barrier layer 15 is 1 μm, but the barrier layer may be interposed, and the thickness may be reduced to about 0.5 km.

The semiconductor device bonding member according to the present invention can be suitably used, for example, for bonding a semiconductor device and an electrode and heat release substrate (current supply substrate) in a power semiconductor module of a type in which a current supply path is formed in a direction perpendicular to a bonding surface of the semiconductor device. Of course, the present invention can also be suitably used in various fields (communication, calculation, memory, laser, LED, sensor, etc.) in which a semiconductor module of a type in which a current supply path is formed in a direction parallel to a bonding surface of a semiconductor device is used. Furthermore, in the IGBT module, the present invention can also be used in a semiconductor module on which a semiconductor device such as Si, GaN, or GaAs is mounted, other than a SiC semiconductor device. The semiconductor device bonding member according to the present invention can greatly contribute to downsizing, high performance, and cost reduction of future semiconductor modules. Moreover, in the present specification, the semiconductor module has been mainly described, but the semiconductor device bonding member according to the present invention can be similarly used for a semiconductor package. For example, the semiconductor device bonding member according to the present invention can also be suitably used for bonding a member having a large difference in linear expansion coefficient, such as a ceramic substrate, to an electrode and heat release substrate made of Cu or the like.

REFERENCE SIGNS LIST

10 . . . Semiconductor Device Bonding Member
11 . . . Thermal Stress Relieving Layer
12 . . . First Ag Brazing Material Layer
13 . . . Second Ag Brazing Material Layer
14 . . . First Barrier Layer
15 . . . Second Barrier Layer
20 . . . Semiconductor Device
21 . . . Layer which shares Bonding Layer Metal with Electrode of Semiconductor Device
30 . . . Electrode and Heat Release Substrate

The invention claimed is:

1. A semiconductor device bonding member used for bonding a semiconductor device and a substrate, the bonding member comprising:
   a thermal stress relieving layer made of any of Ag, Cu, Au, and Al;
   a first Ag brazing material layer containing Ag and Sn as main components and provided on a side of the thermal stress relieving layer to which the semiconductor device is bonded;
   a second Ag brazing material layer containing Ag and Sn as main components and provided on a side of the thermal stress relieving layer to which the substrate is bonded;
   a first barrier layer made of Ni and/or Ni alloy and provided between the stress relieving layer and the first Ag brazing material layer; and
   a second barrier layer made of Ni and/or Ni alloy and provided between the stress relieving layer and the second Ag brazing material layer,
   wherein a thermal conductivity is 200 W/m·K or more after a power cycle test in which heating to 300° C. by current supply and cooling to 25° C. are repeated 30,000 times.

2. The semiconductor device bonding member according to claim 1, wherein the thermal stress relieving layer is made of Ag.

3. The semiconductor device bonding member according to claim 1, wherein a porosity of the first Ag brazing material layer and the second Ag brazing material layer is 5 vol % or less, and a total thickness of the first Ag brazing material layer and the second Ag brazing material layer is 10% or less of a thickness of the entire bonding member.

4. The semiconductor device bonding member according to claim 1, wherein the thermal stress relieving layer has a porosity of 40 vol % or less.

5. The semiconductor device bonding member according to claim 1, wherein an overall thickness is 10 μm or more and 300 μm or less.

6. A semiconductor module comprising the semiconductor device bonding member according to claim 1.

* * * * *